United States Patent
Boone, Jr. et al.

(10) Patent No.: US 7,881,020 B2
(45) Date of Patent: Feb. 1, 2011

(54) EXTRAORDINARY MAGNETORESISTIVE (EMR) DEVICE WITH NOVEL LEAD STRUCTURE

(75) Inventors: Thomas Dudley Boone, Jr., San Jose, CA (US); Liesl Folks, Campbell, CA (US); Bruce Alvin Gurney, San Rafael, CA (US); Jordan Asher Katine, Mountain View, CA (US); Ernesto E. Marinero, Saratoga, CA (US); Neil Smith, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 935 days.

(21) Appl. No.: 11/747,683

(22) Filed: May 11, 2007

(65) Prior Publication Data
US 2008/0278860 A1 Nov. 13, 2008

(51) Int. Cl.
*G11B 5/39* (2006.01)
*H01L 29/82* (2006.01)
*G01R 33/02* (2006.01)

(52) U.S. Cl. .............. 360/322; 360/313; 257/421; 324/252; 29/603.07; 29/603.18

(58) Field of Classification Search ...... 360/313–324.2; 257/421–427; 324/244–263; 338/32 R; 29/603.07, 603.16, 603.18
See application file for complete search history.

(56) References Cited

U.S. PATENT DOCUMENTS

| | | | | |
|---|---|---|---|---|
| 6,707,122 | B1 | 3/2004 | Hines et al. | 257/421 |
| 6,807,032 | B1 | 10/2004 | Seigler et al. | 360/319 |
| 7,082,838 | B2 | 8/2006 | Rowe et al. | 73/777 |
| 7,105,903 | B2 | 9/2006 | Butcher et al. | 257/421 |
| 7,203,036 | B2 * | 4/2007 | Chattopadhyay et al. | 360/313 |
| 7,502,206 | B2 * | 3/2009 | Gurney et al. | 360/313 |
| 7,633,718 | B2 * | 12/2009 | Fontana et al. | 360/245.8 |
| 2006/0018054 | A1 | 1/2006 | Chattopadhyay et al. | 360/313 |
| 2006/0022672 | A1 | 2/2006 | Chattopadhyay et al. | 324/252 |
| 2006/0246692 | A1 | 11/2006 | Shibata et al. | 438/483 |
| 2006/0289984 | A1 | 12/2006 | Fontana, Jr. et al. | 257/692 |
| 2007/0285848 | A1 * | 12/2007 | Williams et al. | 360/324.1 |

* cited by examiner

*Primary Examiner*—A. J. Heinz
(74) *Attorney, Agent, or Firm*—Zilka-Kotab, PC

(57) ABSTRACT

An extraordinary magnetoresistive sensor (EMR sensor) having reduced size and increased resolution is described. The sensor includes a plurality of electrically conductive leads contacting a magnetically active layer and also includes an electrically conductive shunt structure. The electrically conductive leads of the sensor and the shunt structure can be formed in a common photolithographic masking and etching process so that they are self aligned with one another. This avoids the need to align multiple photolithographic processing steps, thereby allowing greatly increased resolution and reduced lead spacing. The EMR sensor can be formed with a magnetically active layer that can be close to or at the air bearing surface (ABS) for improved magnetic spacing with an adjacent magnetic medium of a data recording system.

27 Claims, 16 Drawing Sheets

EXTRAORDINARY MAGNETORESISTIVE (EMR) DEVICE WITH NOVEL LEAD STRUCTURE

FIELD OF THE INVENTION

The present invention relates generally to extraordinary magnetoresistive (EMR) sensors and more particularly to an EMR sensor design that overcomes lithographic alignment limitations, through a novel contact structure.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is oriented generally perpendicular to the air bearing surface (ABS) and the magnetic moment of the free layer is oriented generally parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The drive for ever increased data rate and data capacity has, however, lead researchers to search for new types of magnetoresistive sensors, capable of increased sensitivity and high signal to noise ratio at decreased track widths. One type of magnetoresistive sensor that has been proposed is what has been called an Extraordinary Magnetoresistive Sensor (EMR). An advantage of EMR sensors is that the active region of the EMR sensor is constructed of non-magnetic semiconductor materials, and does not suffer from the problem of magnetic noise that exists in giant magnetoresistive sensors (GMR) and tunnel valves, both of which use magnetic films in their active regions.

The EMR sensor includes a pair of voltage leads and a pair of current, leads in contact with one side of the active region and an electrically conductive shunt in contact with the other side of the active region, in the absence of an applied magnetic field, sense current conducted through the current leads passes into the semiconductor active region and is shunted through the shunt. When an applied magnetic field is present, current is deflected from the shunt and passes primarily through the semiconductor active region. The change in electrical resistance due to the applied magnetic field is detected across the voltage leads. An EMR sensor is described by T. Zhou et al., "Extraordinary magnetoresistance in externally shunted van der Pauw plates", Appl. Phys. Lett., Vol. 78, No. 5, 29 Jan. 2001, pp. 667-669.

However, even with the advantages of such EMR devices, there is an ever pressing need for increasing the data rate and data density of data that can be read from a device. As these EMR devices become ever smaller, the ability to create the necessary extremely small leads and extremely small lead spacing is limited by the resolution limits of current photolithographic techniques and by the need to align multiple photolithographic patterning steps.

Therefore, there is a strong felt need for an EMR sensor design and method of manufacture that can allow such a sensor to be constructed at very small sizes in spite of the resolution limits of currently available photolithography processes. Such a structure and/or method would preferably allow the leads of such devices to be constructed at extremely small lead spacing so to allow very short, magnetic bits to be read. Additionally, as the data density of magnetic recording increases, the necessarily smaller size of the magnetic bits requires that the magnetically active parts of the readback sensor be closer and closer to the disk in order to resolve the separate magnetic bits. As a consequence, there is a strong felt need for the magnetically active layer of an EMR sensor to be close to the air bearing surface (ABS).

SUMMARY OF THE INVENTION

The present invention provides an Extraordinary Magnetoresistive (EMR) sensor having a novel self aligned lead structure. The EMR sensor includes voltage leads and current leads that are self aligned with one another and also with a shunt structure, which allows the leads to be formed with a greatly reduced lead spacing.

The EMR sensor can include a mesa structure having a plurality of notches formed in a side of the mesa structure.

Voltage and current leads can be formed to extend into the notches, contacting a magnetically active portion of the EMR sensor.

The EMR sensor can also be constructed without notches. In that case the leads can still be self aligned with each other and with the shunt structure and can be formed in a common photolithographic process.

The EMR sensor can also be formed without forming a mesa structure. A magnetically active portion of the EMR sensor is formed and a thin electrically conductive layer is formed over the EMR sensor. A plurality of leads and a shunt structure can be formed to extend through the insulation layer to contact the magnetically active portion of the EMR sensor.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
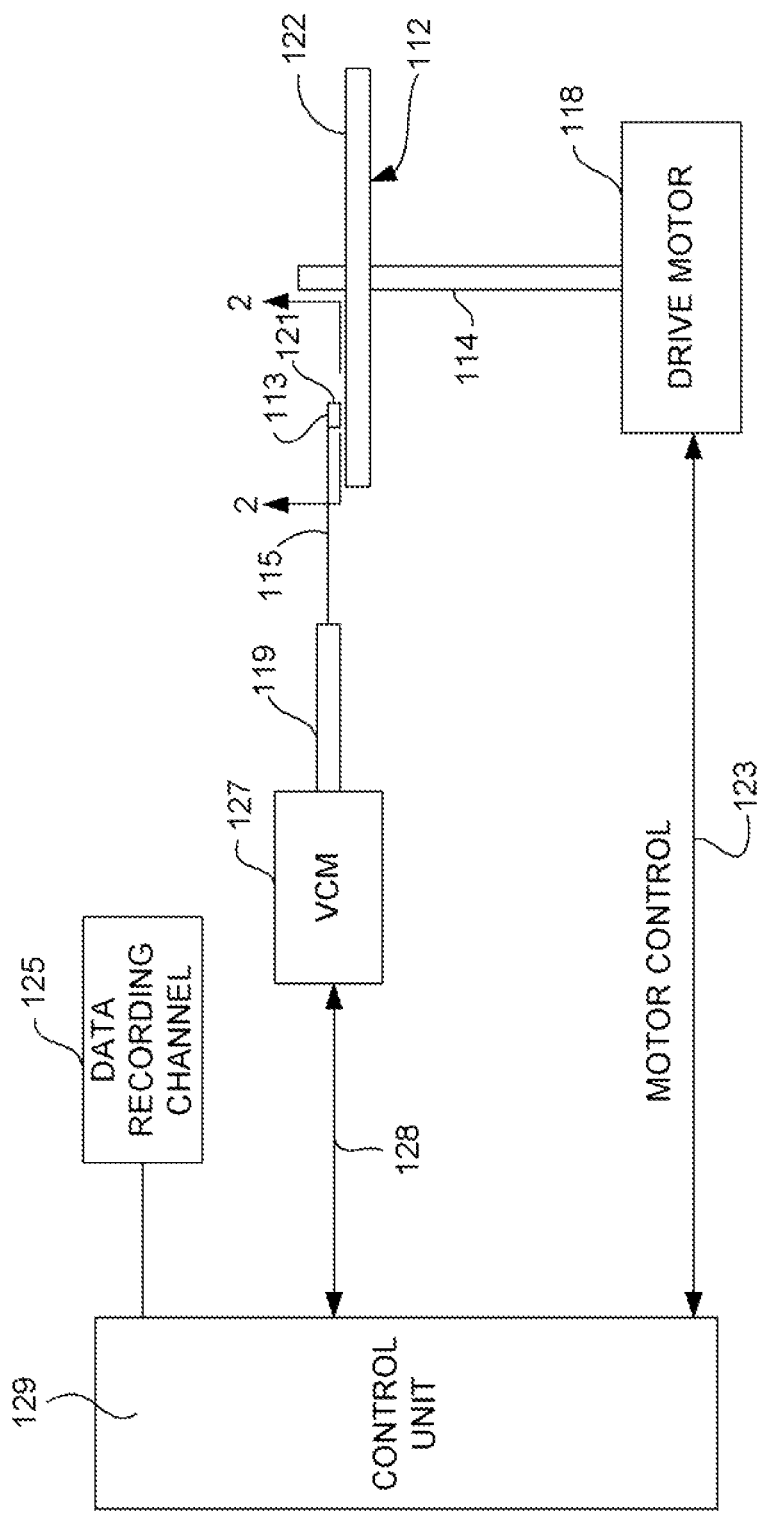
FIG. 1 is a schematic illustration of a disk drive system in which the invention might be embodied.

Referring now to FIG. 1, there is shown a disk drive 100 which could embody this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125. The read portion of the head 121 can be an Extraordinary Magnetoresistive (EMR) sensor such as will be described below.

Figure 2:
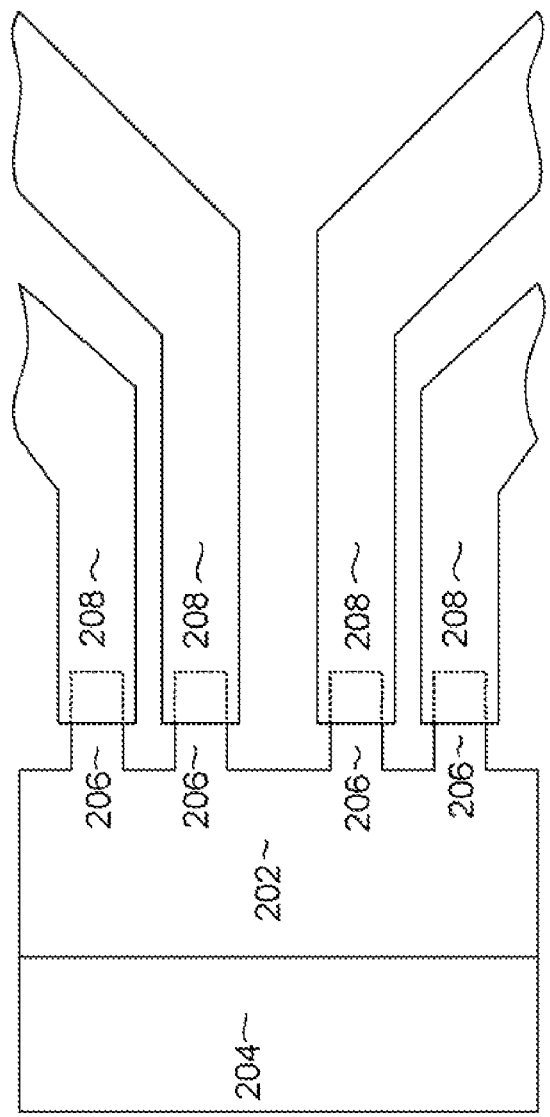
FIG. 2 is schematic, top down view of a prior art EMR device.

With reference to FIG. 2, an example of a prior art EMR sensor has included a mesa structure 202 and a shunt structure 204. The mesa structure has been configured with tabs 206 that extend from a side of the mesa structure 202 opposite the shunt 204. These tabs 206 provide contact points to which electrically conductive leads 208 can connect. The function of an EMR sensor will be described in greater detail below with respect to a description of an embodiment of the invention.

With continued reference to FIG. 2, the tabs 206 are constructed by a photolithographic process during definition of the mesa structure 202 and are integral with the mesa structure. The leads 208 are defined by a separate photolithographic process that must be aligned with the tabs 206 created by the previous photolithographic process. The shunt structure 204 could be defined in yet another photolithographic processing step. As those skilled in the art will appreciate, the alignment of these various photolithographic process steps is very difficult and at very small sizes becomes impossible, thereby limiting the amount by which the size and resolution of the EMR sensor can be reduced to increase data density.

Figure 3:
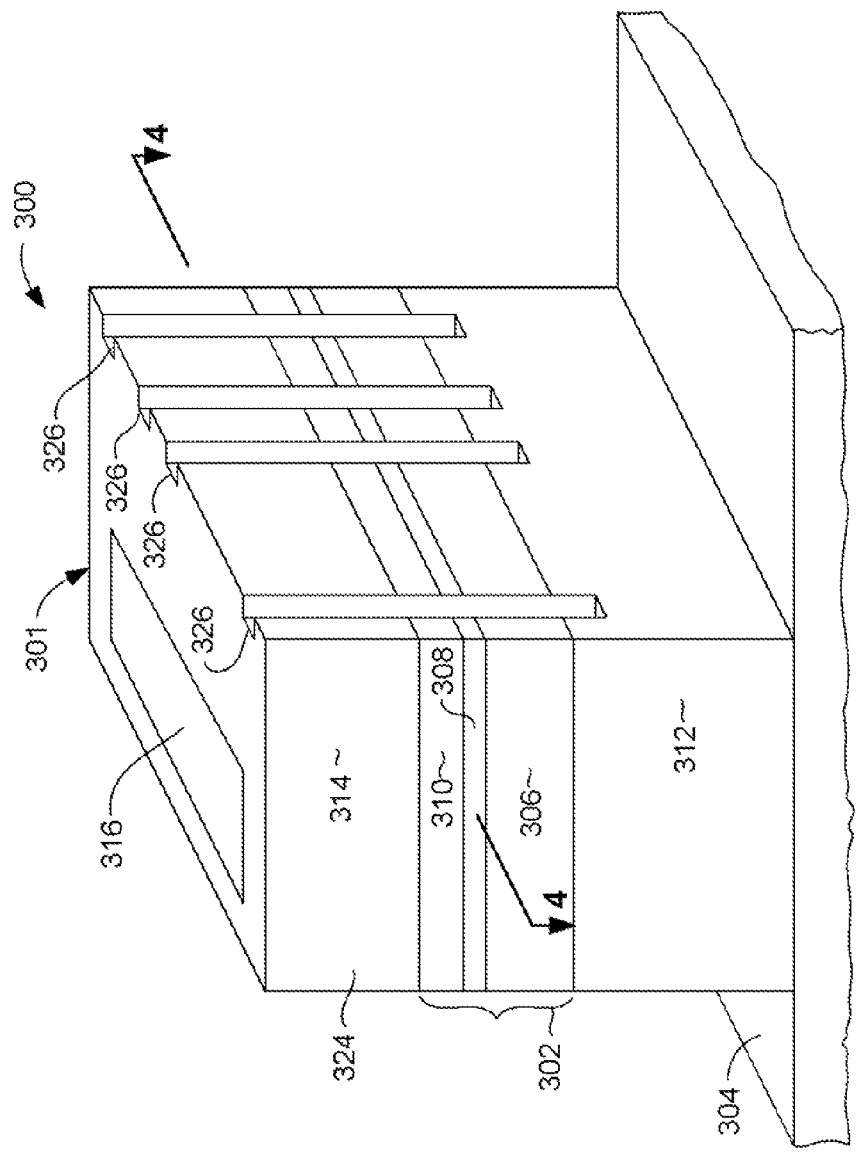
FIG. 3 is schematic isometric view of an EMR device according to an embodiment of the invention.

With reference now to FIG. 3, an Extraordinary MagnetoResistive sensor (EMR) sensor 300 for use in a magnetic head 121 (FIG. 2) is shown according to a possible embodiment of the invention. The EMR sensor 300 includes a mesa structure 301 formed on a substrate 304 such as a wafer. The mesa structure 301 includes a heterostructure 302 that includes a 2 Dimensional Electron Gas (2-DEG) 308 sandwiched between first and second layers of higher resistance semiconductor layers 306, 310. The mesa structure 301 can also include a buffer layer 312 underlying the structure 302. A capping layer 314 may also be provided at the top of the mesa structure to protect the underlying layers 306-310 of the mesa structure 301. The EMR sensor 301 also includes an electrically conductive shunt structure 316, the top end of which is shown, but which extends downward into the mesa structure 301 as will be described in greater detail herein below.

The EMR sensor 300 may include a structure 302 that is a III-V heterostructure formed on a semiconductor substrate 304 such as GaAs. However, the EMR sensor described in this invention is not restricted to III-V semiconductor materials. For example, it may also be formed on the basis of silicon or germanium. The heterostructure 302 can include a first layer 306 of semi-conducting material having a first band-gap, a second layer 308 of semi-conducting material formed on the first layer 306 and having a second bandgap that is smaller than that of the first layer 306, and a third semi-conducting layer 310 of semi-conducting material formed on top of the second layer 308 and having a third band gap that is greater than the second band gap. The materials in the first and third layers 306, 310 may be similar or identical. An energetic potential well (quantum well) is created by the first, second and third semi-conducting material layers 306, 308, 310 due to the different band-gaps of the different materials. Thus, carriers can be confined inside layer 308, which is considered the EMR active film in the sensor 300. Because the layer 308 is extremely thin, and because electrons travel very fast and at very long distances without scattering, this layer 308, forms what has been referred to as a 2 Dimensional Electron Gas (2DEG).

The first layer 306 is typically formed on top of a buffer layer 312 that may be one or more layers. The buffer layer 312 comprises several periods of a superlattice structure that functions to prevent impurities present in the substrate from migrating into the functional layers 306, 308, 310. In addition, the buffer layer 312 is chosen to accommodate the typically different lattice constants of the substrate 304 and the functional layers of the heterostructure 302 to thus act as a strain relief layer between the substrate and the functional layers.

One or more doped layers can be incorporated into the semiconducting material in the first layer 306, the third layer 310, or both layers 306 and 310, and spaced apart from the boundary of the second and third semiconducting materials. Dopants are also sometimes incorporated in layer 312 or 314 at locations near layers 306 or 310. The doped layers provide electrons (if n-doped) or holes (if p doped) to the quantum well. The electrons or holes are concentrated in the quantum well in the form of a two dimensional electron-gas or hole-gas, respectively.

The layers 306, 308, 310 may be a $Al_{0.09}In_{0.91}Sb/InSb/Al_{0.09}In_{0.91}Sb$ or AlSb/InAs/AlSb heterostructure grown onto a semi-insulating GaAs substrate 304 with a buffer layer 312 in between. InSb and InAs are narrow band-gap semiconductor. Narrow band-gap semiconductors typically have a high electron mobility, since the effective electron mass is greatly reduced. Typical narrow band-gap materials are InSb and InAs. For example, the room temperature electron mobility of InSb and In As are 70,000 $cm^2/Vs$ and 35,000 $cm^2/Vs$, respectively.

The bottom $Al_{0.09}In_{0.91}Sb$ or GaAlSb layer 306 formed on the buffer layer 312 has a thickness in the range of approximately 1-3 microns and the top $Al_{0.09}In_{0.91}Sb$ or AlSb layer 310 has a thickness in the range of approximately 2 to 1000 nm. The doping layers incorporated into layers 306, 310 have a thickness from one monolayer (delta-doped layer) up to 10 nm. The doping layer is spaced from the $In/Sb/Al_{0.09}In_{0.91}Sb$ boundaries of first and second or second and third semi-conducting materials by a distance of 10-300 Angstrom. N-doping is preferred, since electrons typically have higher mobility than holes. The typical n-dopant is silicon with a concentration of about $1 \times 10^{19}/cm^3$. The deposition process for the heterostructure 302 is preferably molecular-beam-epitaxy, but other epitaxial growth methods can be used.

A capping layer 314 is formed over the heterostructure 302 to protect the device from corrosion. The capping layer 314 is formed of an insulating material such as oxides or nitrides of aluminum or silicon (e.g., $Si_3N_4$, $Al_2O_3$) or a non-corrosive semi-insulating semiconductor. The layers 312, 306, 308, 310, 314 together form a structure that can be referred to as a mesa structure 301.

As can be seen, in FIG. 3, the mesa structure 301 can be configured with cutout notches 326 formed in a side of the mesa structure. The notches provide a contact region for electrical leads that are not shown in FIG. 3, but which will be shown and described in subsequent figures. The leads and also an optional fill layer have been removed from FIG. 3, in order to more clearly show the mesa structure 300 and associated notches 326. As can be seen, the notches 326 extend from the top of the mesa structure 301 to a point beneath the quantum well layer 308, also referred to as the magnetically active region or 2-DEG 308, and preferably extend beyond the entire heterostructure 302. As will be seen below, the notches 326 are optional (e.g. they can be configured with a depth from the side that can vary down to zero). However, the presence of the notches increases the surface area over which the leads (not shown in FIG. 3) can make contact.

Figure 4:
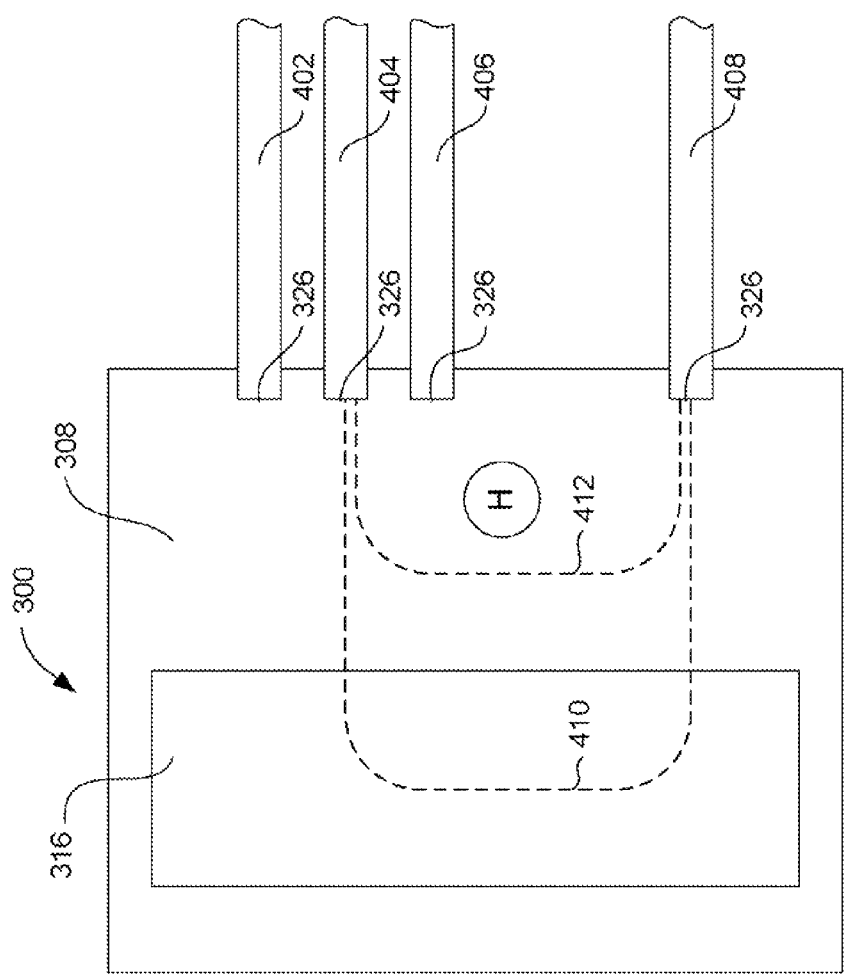
FIG. 4 is a top-down, cross sectional view taken from line 4-4 of FIG. 3.

FIG. 4, shows a cross sectional view taken from line 4-4 of FIG. 3. FIG. 4 therefore, shows a top down view of the quantum well portion 308 of the mesa structure 301 as well as the shunt 316 passing there-through. A set of electrically conductive leads 402, 404, 406, 408 extend into the notches formed in the mesa structure. The leads 402, 404, 406, 408 can be constructed of an electrically conductive material such as, for example, Au or AuGe, and for reasons that will become apparent below, can be preferably constructed of the same material as the shunt structure 316.

With continued reference to FIG. 4, two of the leads, such as 404 and 408, are current leads for supplying a sense current to the sensor 300 and, more specifically, to the 2-DEG layer 308. Therefore, lead layer 408 can be a first current lead I1, and lead layer 404 can be a second current lead layer I2. Lead layers 406 and 402 can provide voltage leads for measuring a change in resistance associated with the presence of a magnetic field, as will be described bellow. Therefore, lead layer 406 can provide a first voltage lead V1 and lead layer 402 can provide a second voltage lead V2.

As mentioned above, the current leads 408, 404 provide a sense current through the sensor 300. In the absence of a magnetic field, a majority of this current (indicated by dashed line 410) passes from the first current lead 408 to the shunt structure. This current then passes through the shunts structure 316 with a relative low resistance before passing back through the 2DEG layer 308 back to the second current lead 404. However, in the presence of magnetic field H oriented generally perpendicular to the plane of the 2-DEG layer, a relatively larger portion of the current is deflected from the shunt 316 to travel through the 2-DEG layer 308 as indicated by dashed line 412. This increases the electrical resistance, which can be detected by measuring a voltage across the voltage leads 406, 402.

As can be seen in FIG. 4, the leads 402-408 can extend into the notches 326. Therefore, the perimeter of contact between a lead and the notch 326 is essentially twice the depth of the notch plus the width of the lead. This increases the electrical contact area, advantageously reducing resistance between the leads 402-408 and the 2-DEG 308. Perhaps more importantly, the leads 402-408 can be self aligned with the notches 326 and also with the shunt, by a single photolithographic step, as will be explained more fully below.

Figure 5:
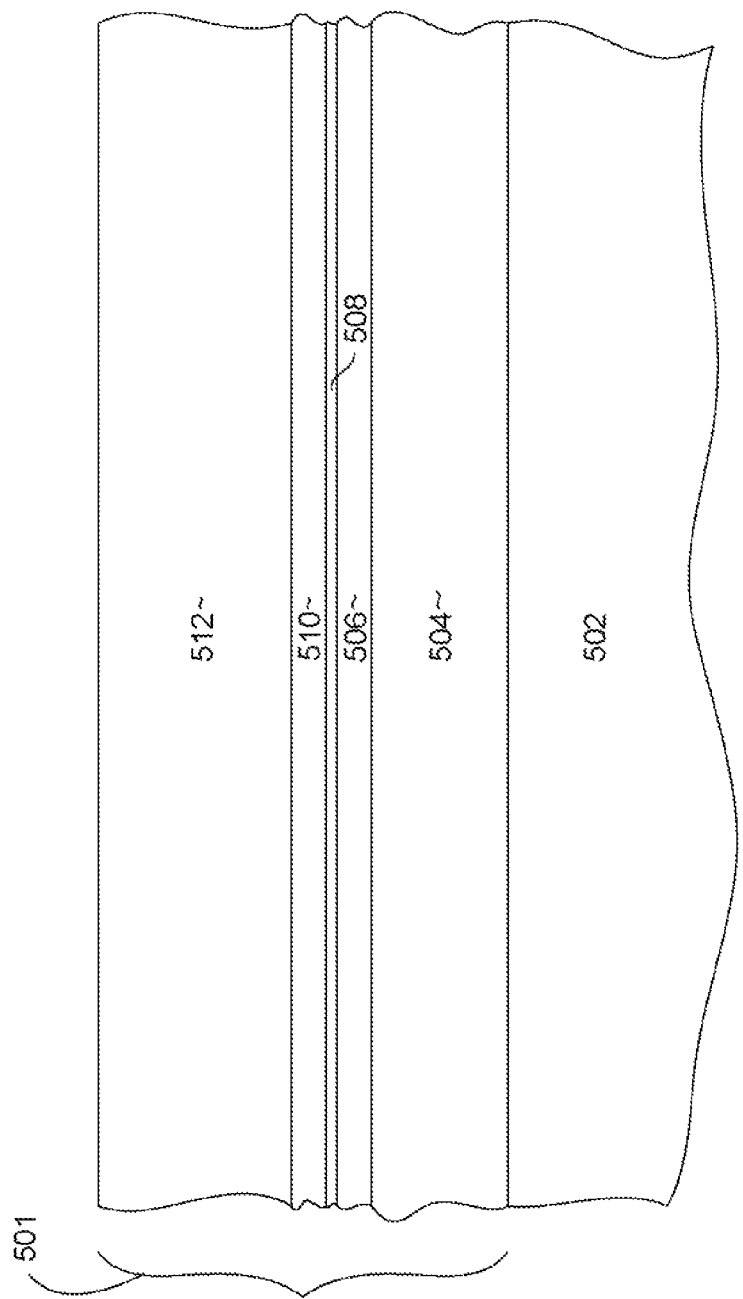
FIGS. 5-11 are views of an EMR device in various intermediate stages of manufacture, illustrating a method of manufacturing an EMR sensor according to an alternate embodiment of the invention.

With reference now to FIGS. 5-11, a method for manufacturing an EMR sensor according to an embodiment of the invention is described. With particular reference to FIG. 5, a substrate 502 is provided. This substrate 502 may be a semiconductor wafer such as GaAs. A plurality of EMR mesa structure layers 501 are grown on the wafer. The EMR mesa structure layers 501 can include a buffer layer 504 which may be more than one layer and may include several periods of a super-lattice structure. A first doped semiconductor layer 506, second semiconductor layer (2-DEG) 508, third semiconductor layer 510 and capping layer 512 are grown over the buffer layer 504. The first and third semiconductor layers 506, 510 can each be constructed of a material such as $Al_{0.09}In_{0.91}Sb$. The 2-DEG layer (second semiconductor layer) 508 can be InSb. However, these are examples only. Other materials could be used for layers 506, 508, 510, with the 2-DEG material layer having a bandgap that is smaller than that of one or both of the layers 506, 510. The capping layer 512 can be constructed of an insulating material such as an oxide or nitride of Si or Al.

Figure 6:
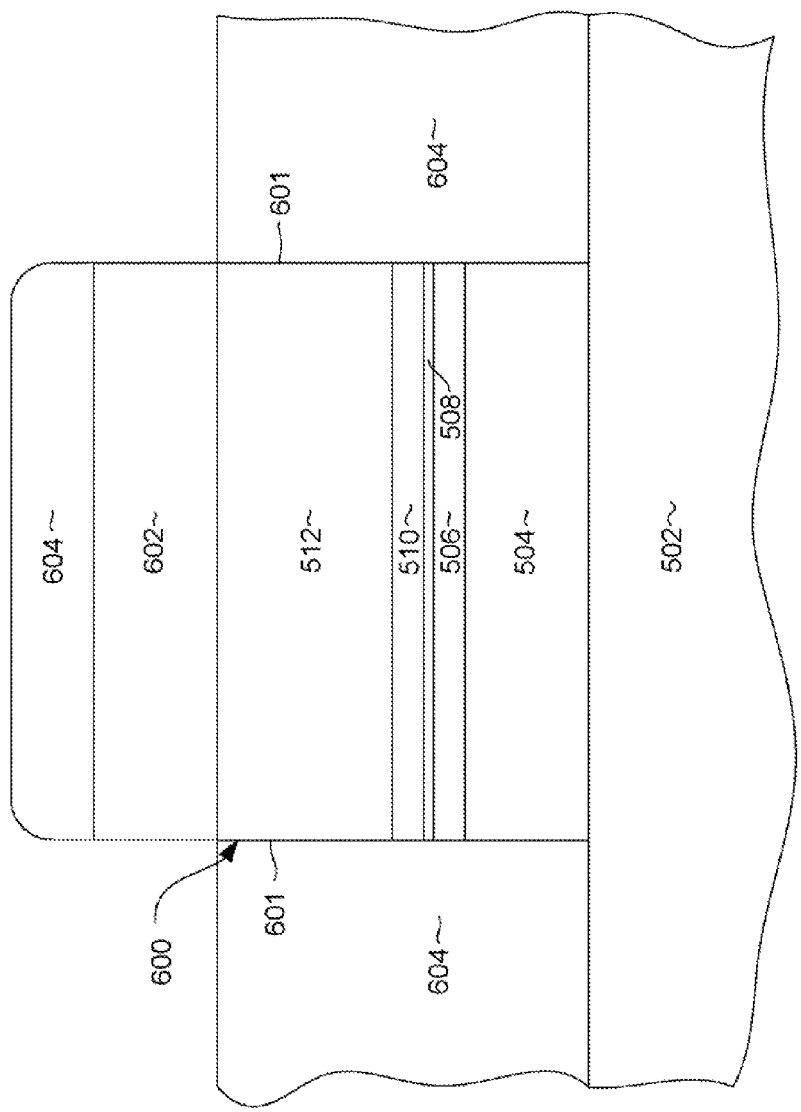
Figure 7:
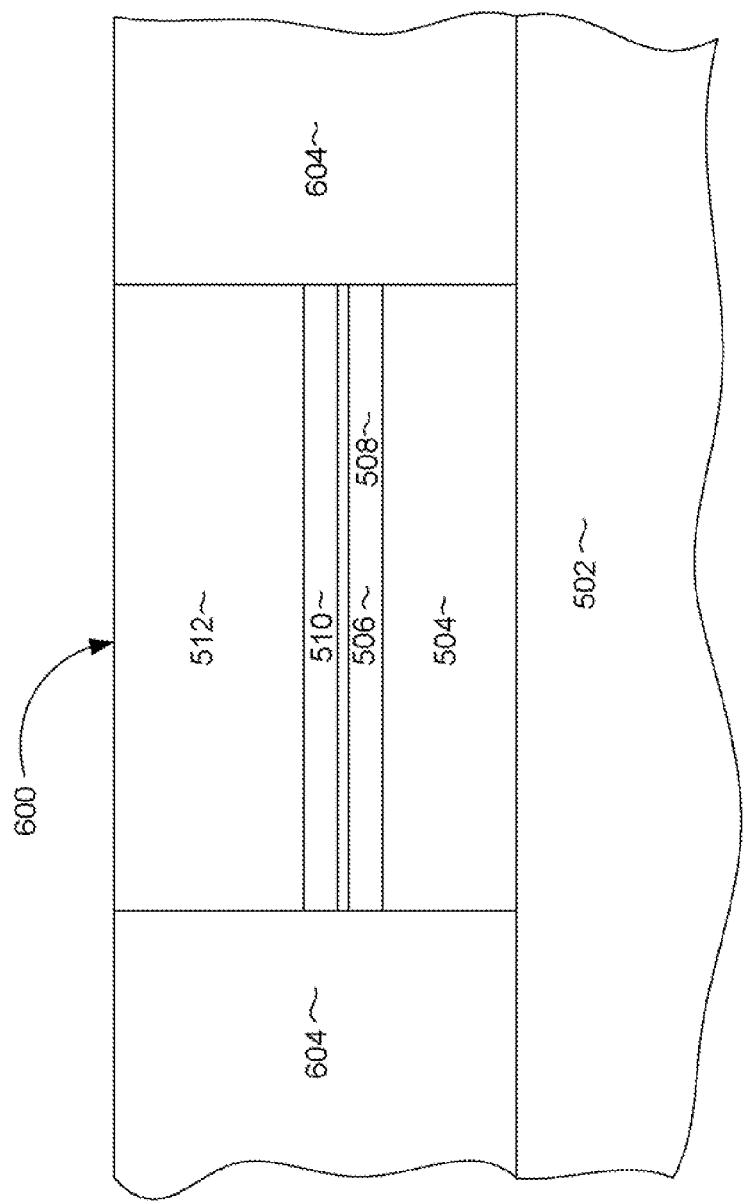

With reference to FIG. 6, a mask 602, such as a photoresist mask is formed over the layers 504-512, and a material removal such as ion milling or an etch process is used to remove portions of the layers 504-512 that are not protected by the mask layer 602. This results in a mesa structure 600 having side walls 601. A non-magnetic, electrically insulating fill layer 604 can be deposited, however this is an optional step, as the EMR sensor can be constructed without a fill layer 604. Then, the mask 602 can be lifted off, leaving the structure as shown in FIG. 7.

Figure 8:
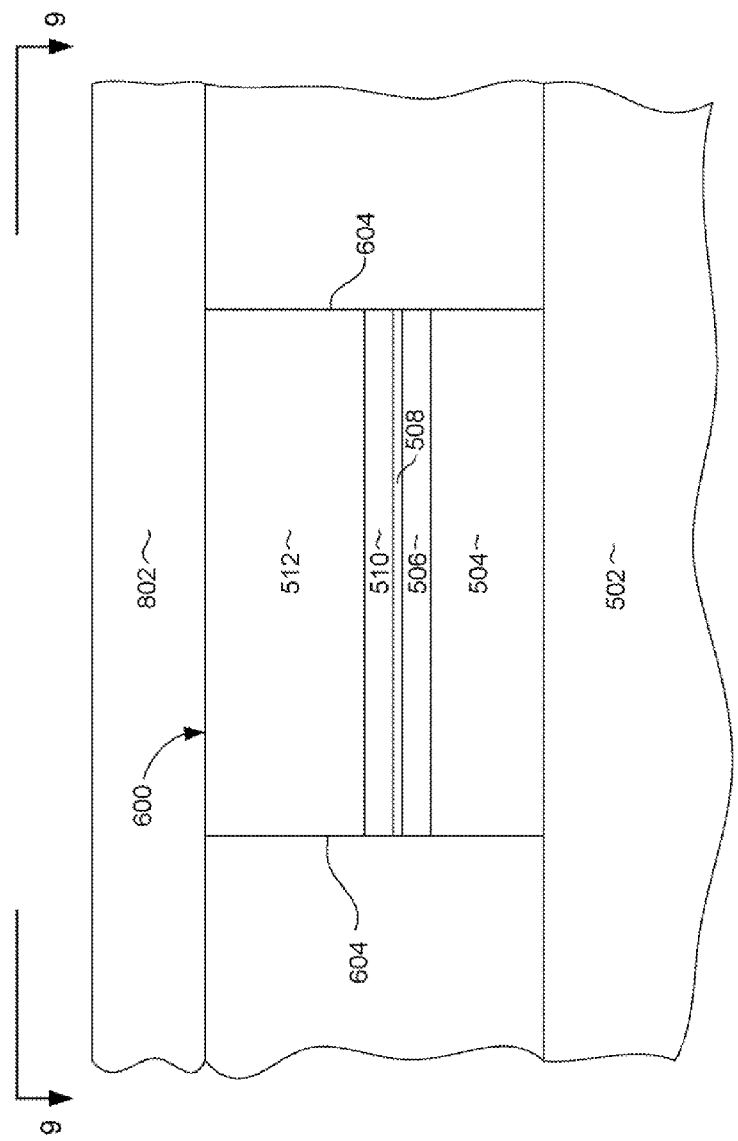
Figure 9:
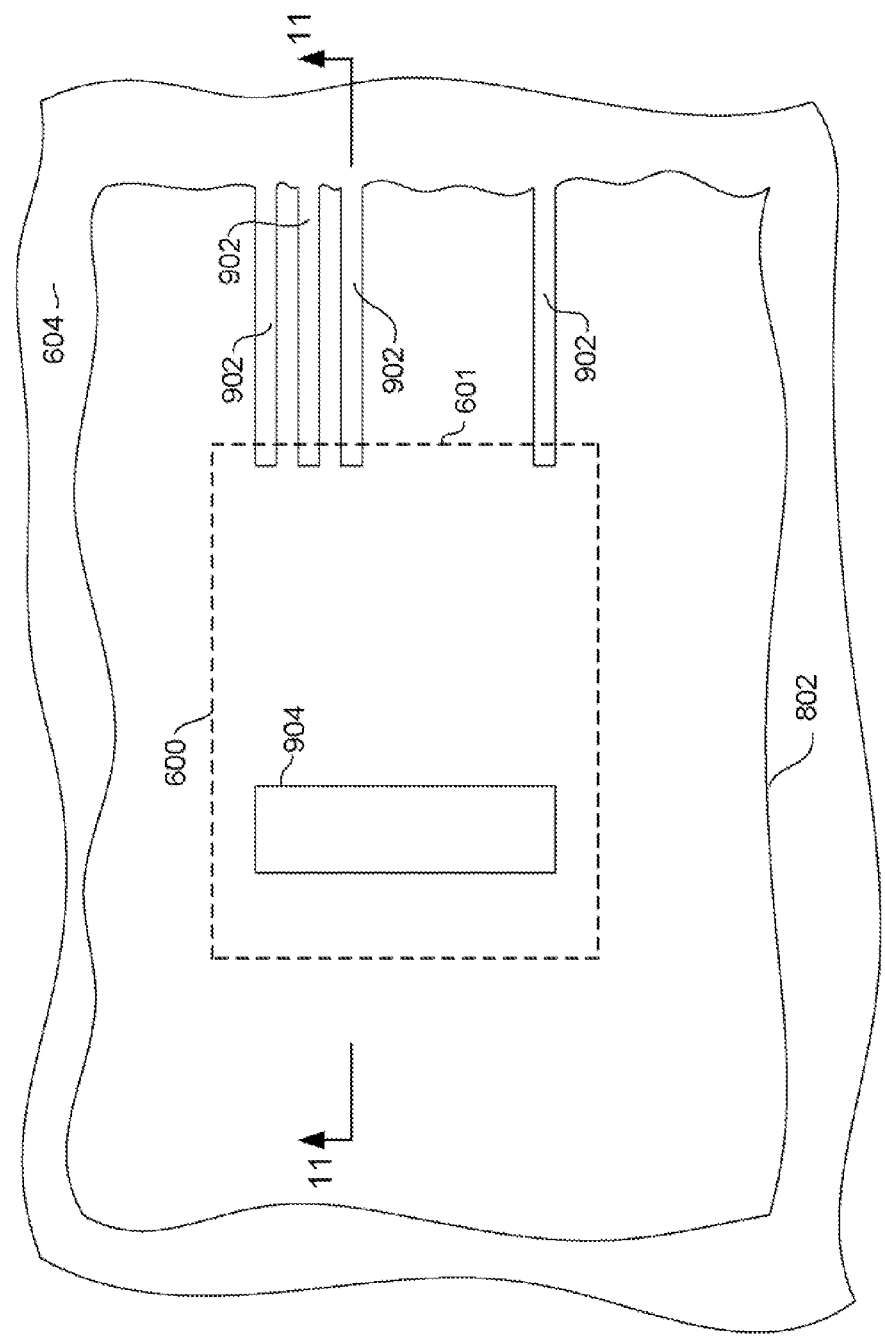

With reference now to FIGS. 8 and 9, a second mask 802 is formed over the mesa layers 504-512 and the fill layer 604 if provided. As shown in FIG. 9, the mask structure includes openings 902 for defining a plurality of leads. The mask 802 also includes an opening 904 for defining a shunt structure. In FIG. 9, the mesa structure 600 is shown in dashed line to indicate that it is hidden beneath the mask 802. The openings 902 can extend over the edge or side 601 of the mesa structure 600. This portion that extends beyond the edge 601 will form the notch 326, described earlier with reference to FIG. 3. Alternatively, with reference to FIG. 10 openings 902 can reach just to the edge 601 of the mesa structure 600. In this case, the mesa structure 600 will not be configured with notches 326 (FIG. 3). Instead, the leads 406 (FIG. 4) will contact the side edge 601 of the mesa structure 600 without extending into a notched structure 326 (FIG. 3).

The mask structure 802 can be formed by a photolithographic process that can include depositing a material such as photoresist, and then photolithographically patterning the photoresist using a photo stepper tool. The resist can then be developed to form a mask structure such as the one shown 802. With reference then to FIG. 9, it can be seen, that the leads and shunt (which will be formed by later processes described below) are defined by a single, common photolithographic masking step. This advantageously avoids the need to align multiple photolithography steps, greatly enhancing the ability to form leads at very small sizes and spacing relative to each other and to the shunt structure with very high resolution. In addition, forming these structures in a single photo step with a single mask reduces manufacturing time and cost by reducing the number of manufacturing steps that must be performed.

Figure 10:
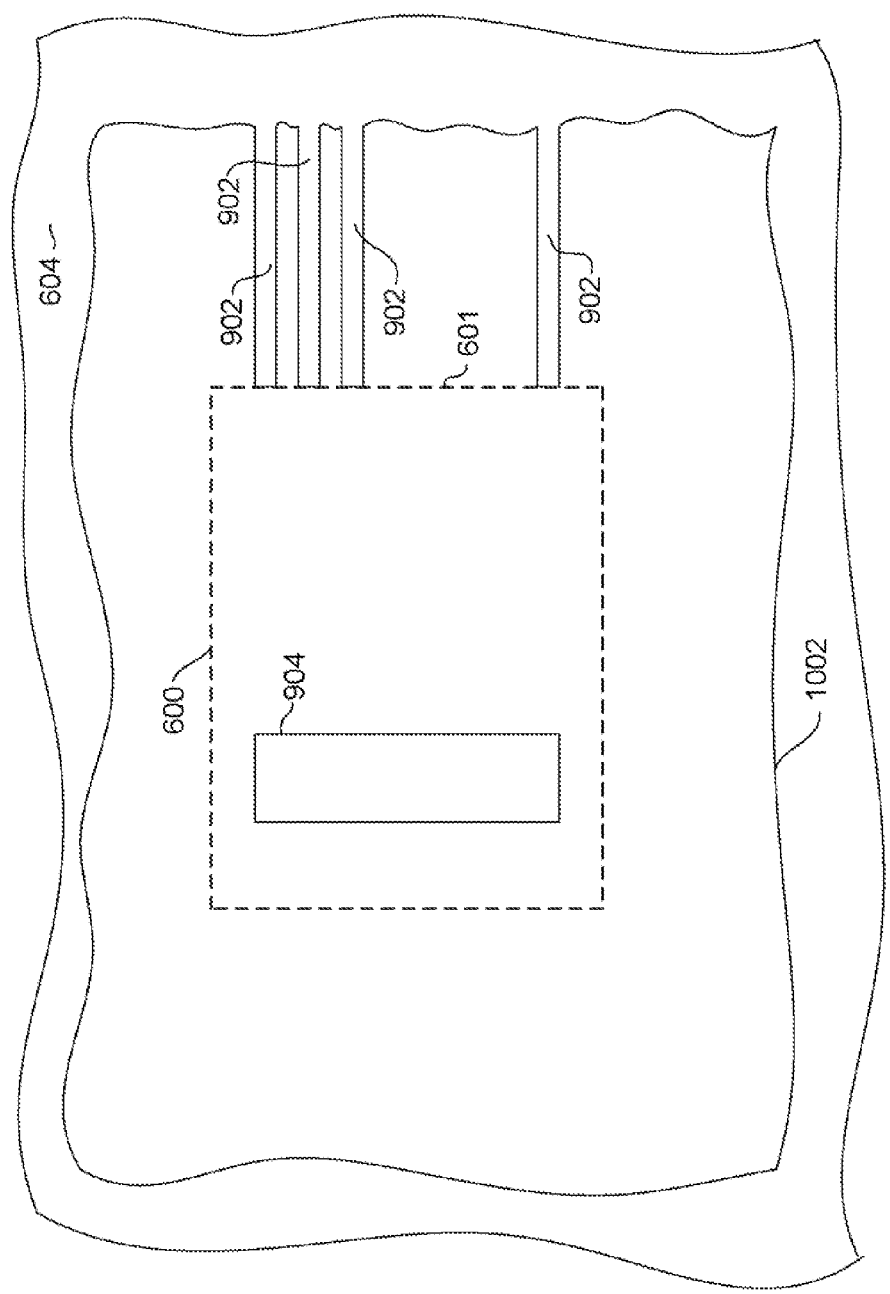
Figure 11:
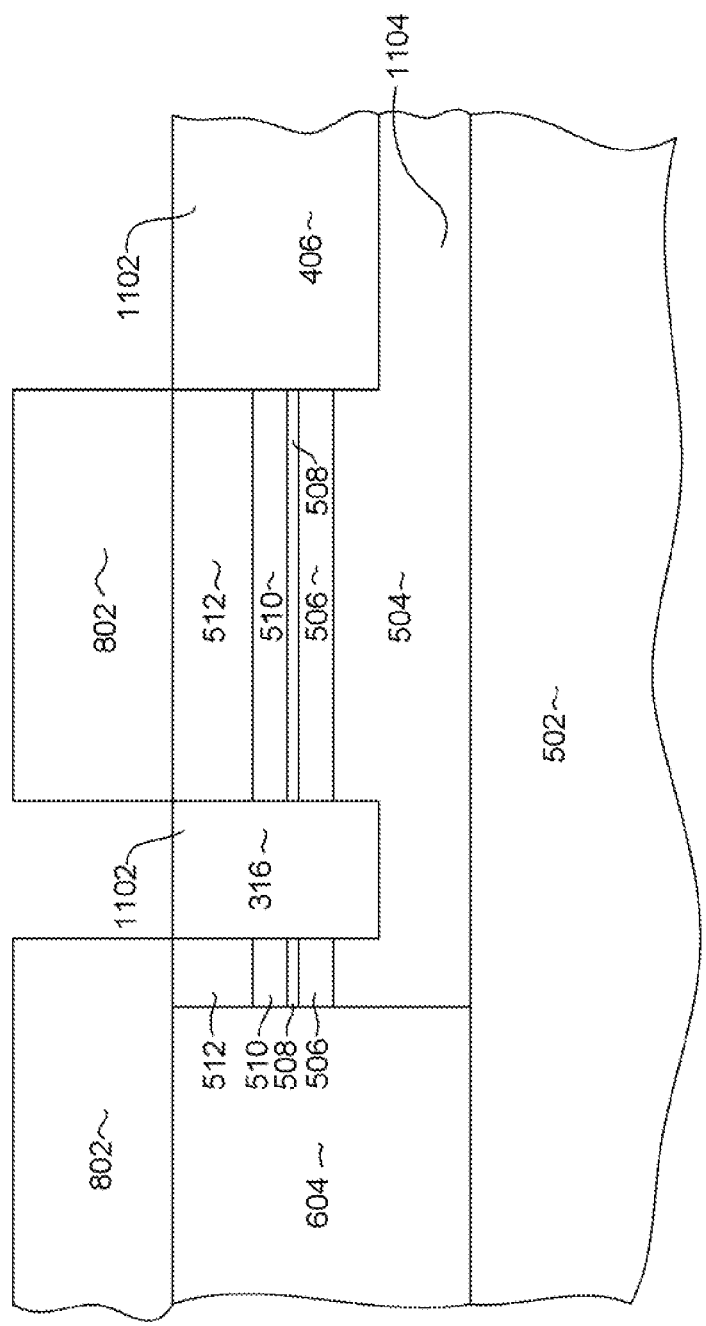

With reference still to FIGS. 9 and 10, with the mask 802 still in place a material removal process such as an etching process can be performed to remove portions of the fill material 604 and mesa structure 600 that are not protected by the mask. This material removal process forms trenches in the fill layer 604 (if a fill is provided) and in the mesa structure 600. An electrically conductive material 1102 such as Au can then be deposited into these trenches. This results in a structure as shown in FIG. 11, which is a side cross sectional view taken from line 11-11 of FIG. 9. This deposition of electrically conductive material results in the formation of leads 402-408 and shunt structure 316 described earlier with reference to FIG. 3, although only the lead 406 is shown in cross section in FIG. 11. As can be seen in FIG. 11, the etching can form a trench having a bottom that extends to a level below the 2-DEG and preferably beyond the first semiconductor layer. The structure shown in FIG. 11, is the notched structure formed by the mask structure 802 shown in FIG. 9. However, if the mask 1002 shown in FIG. 10 were used, there would be no notch, and the leads 406 would just contact the side of the mesa structure 600.

It should be pointed out that the mask 602 (FIG. 6) and mask 802 (FIGS. 8 and 9) could be combined into a single mask structure. In that case, the mesa structure 600, leads 902 and shunt 904, could all be defined by a single mask formed in a single photolithographic process. In addition, the formation of a mesa structure 600 could be eliminated altogether, as will be described below.

Figure 12:
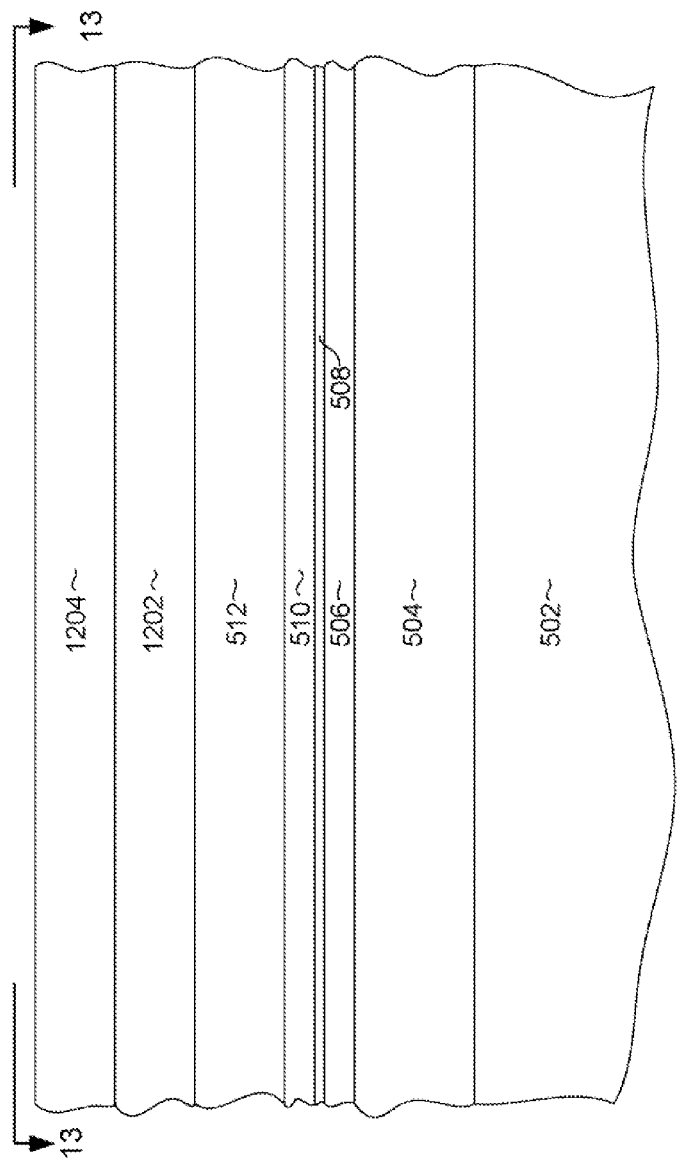
FIGS. 12-14 are views of an EMR device in various intermediate stages of manufacture, illustrating a method of manufacturing an EMR sensor according to an alternate embodiment of the invention.
Figure 13:
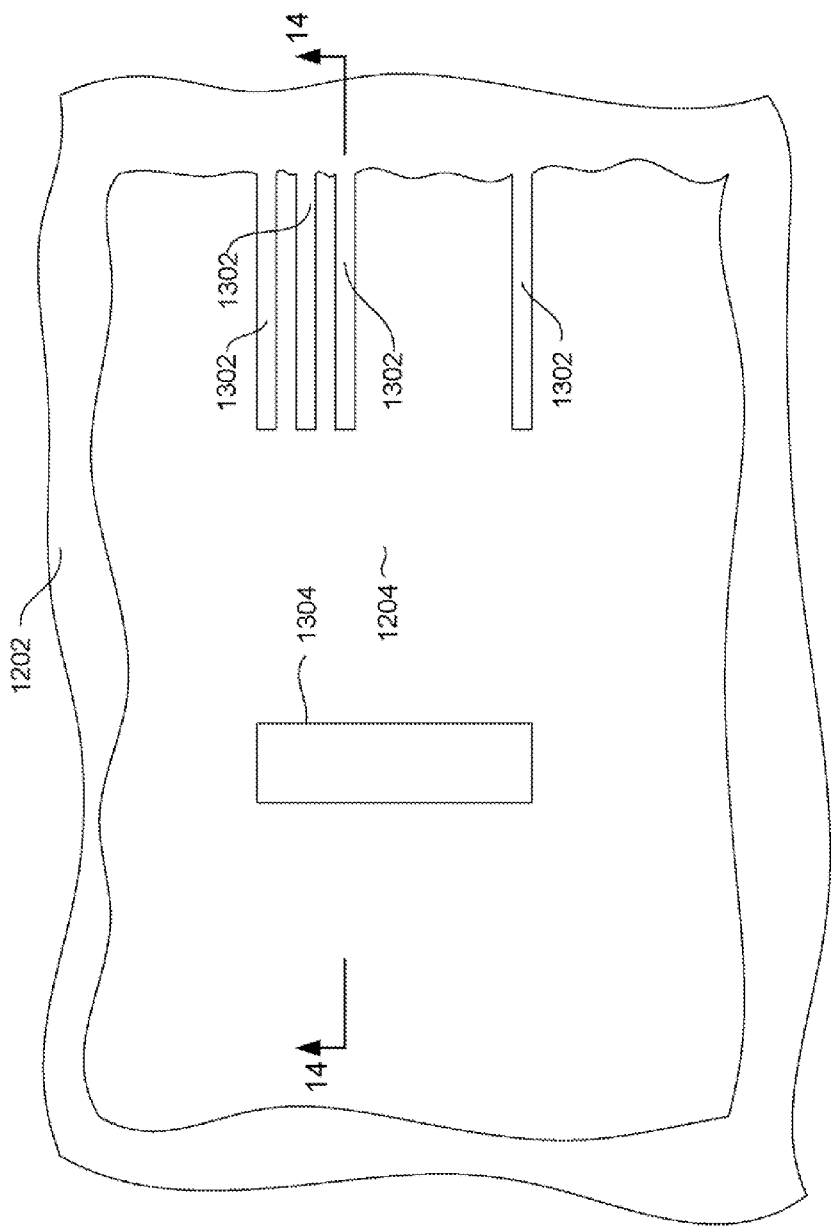
Figure 14:
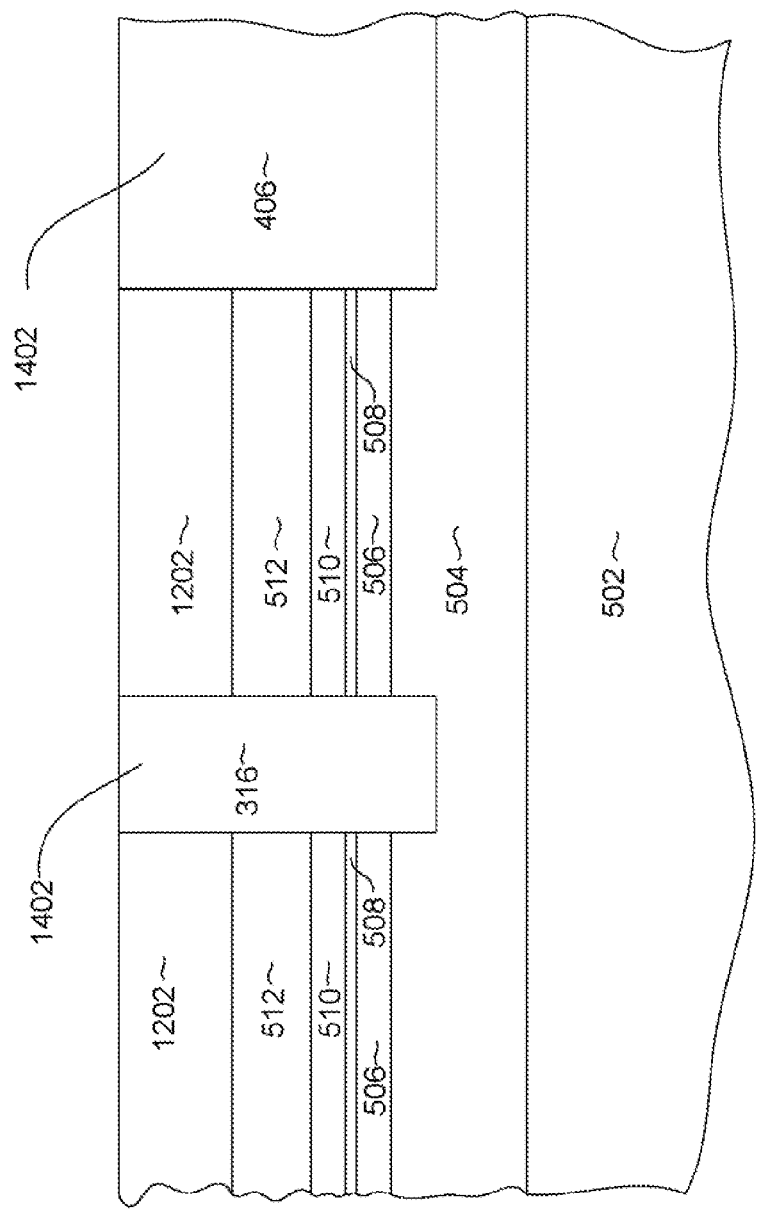

With reference now to FIGS. 12-14, a method for manufacturing an EMR sensor according to an alternate embodiment of the invention is described. The previously described layers 504-512 are grown on a wafer 502. Then, in addition, an insulation layer 1202 is grown or deposited full film over the layers 504-512. A mask structure 1204 is then formed over the insulation layer. The mask 1204 can be a resist mask, photolithographically patterned by methods such as those previously described. As can be seen with reference to FIGS. 12 and 13, the mask 1204 is formed over the insulation layer 1202 and EMR layers 504-512 without first forming a mesa structure.

With reference to FIG. 13, a plurality of lead openings 1302 are formed in the mask structure 1204. In addition, the mask structure includes a shunt opening 1304. With the mask 1204 in place, a material removal process can be performed to remove portions of the insulation layer 1202 that are not covered by the mask layer as well as the underlying layers 504-512. An electrically conductive material 1402 such as Au, can then be deposited, resulting in a structure having leads 402-408 (FIG. 4) and a shunt structure 316, but no actual mesa structure with side walls. Although only one lead 406 is shown in FIG. 14, it should be understood, that this is only because FIG. 14 is a side cross sectional view that can only show one of the leads. It should, therefore, be understood that the other leads 402, 404, 408 would be included as well.

The locations of the leads relative to one another and relative to the shunt structure are important to EMR sensor performance. Therefore, since the leads 402-408 and shunt 316 are formed in a common photolithographic step, and because the rest of the EMR structure is covered with an insulator, there is no need to form the box shaped mesa structure previously described.

In an EMR device such as that described with reference to FIGS. 12-14, the air bearing surface (if the device is used in a data recording system) would be located beneath the device as it is shown in FIGS. 12-14. In this case, the ABS could be located within the buffer layer 504 or at the lower semiconductor layer 506. This could be achieved by a back lapping process, wherein the wafer is lapped from beneath until a desired location within the EMR sensor is reached. Alternatively, this could be achieved by an etching lift off process.

For example, all or a portion of the buffer layer 504 could be constructed of a selectably etchable material. This material could be etched away using a desired etchant until the EMR sensor lifts off of the wafer 502. This process could be referred to as an epitaxial liftoff process.

Figure 15:
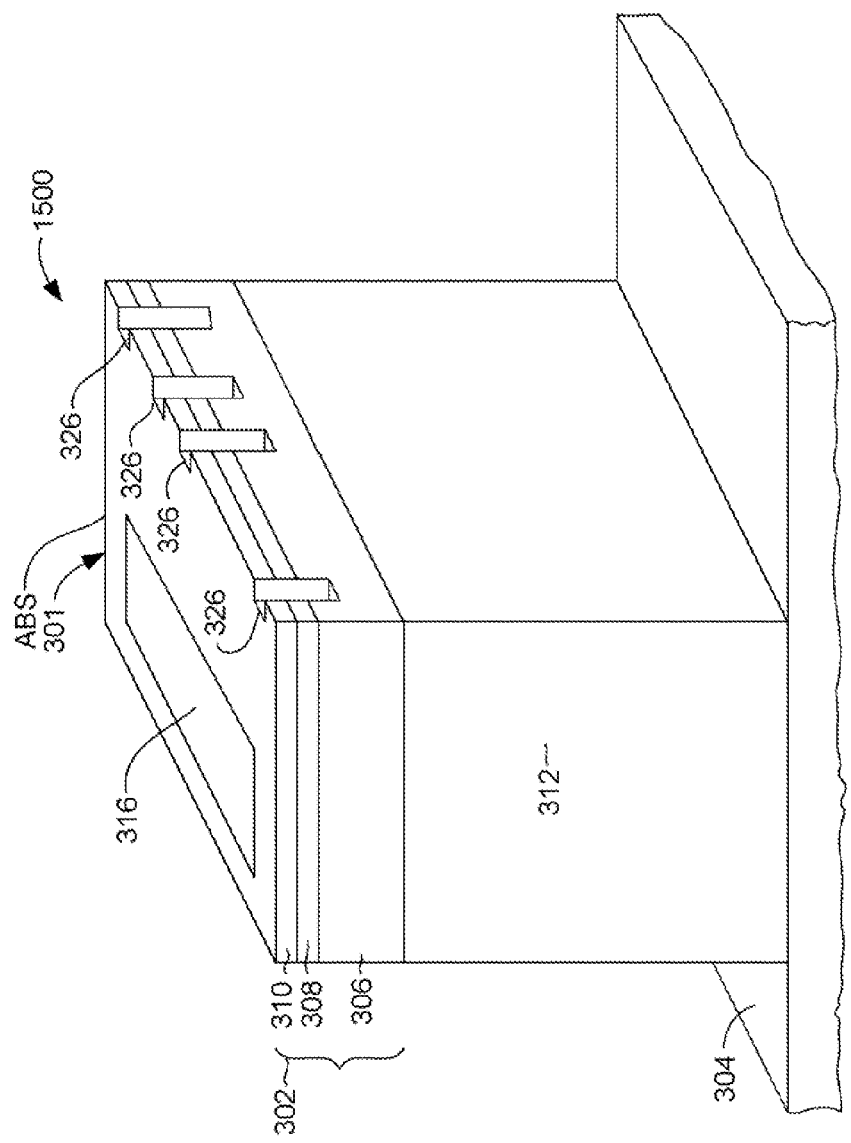
FIG. 15 is a schematic isometric view of an EMR sensor according to another embodiment of the invention.

With reference now to FIG. 15, another possible embodiment of the invention is described. In this embodiment, the capping layer 314, described above with reference to FIG. 3, has been removed, and the upper semiconductor layer 310 is made as small as possible. The upper semiconductor layer can actually be less than 2 nm thick. This pushes the magnetically active layer 308 (eg. 2-DEG layer) much closer to the top of the mesa structure 301. In fact, the magnetically active layer 308 could be 1-50 nm from the ABS, or even more preferably 1-30 nm or 1-10 nm from the ABS. If the EMR sensor 1500 is used as a magnetoresistive sensor in a magnetic data recording device such as a disk drive, this allows the magnetically active layer 308 to be much closer to the magnetic medium (not shown in FIG. 15). Magnetic spacing is a very important parameter in current, and future data recording devices, and a reduction of even a few nano-meters (nm) of magnetic spacing can make a huge difference to performance. Therefore, by pushing the magnetically active layer 308 close to the surface of the mesa structure 301, the magnetic spacing and associated magnetic performance of a magnetic data recording system can be greatly improved.

Figure 16:
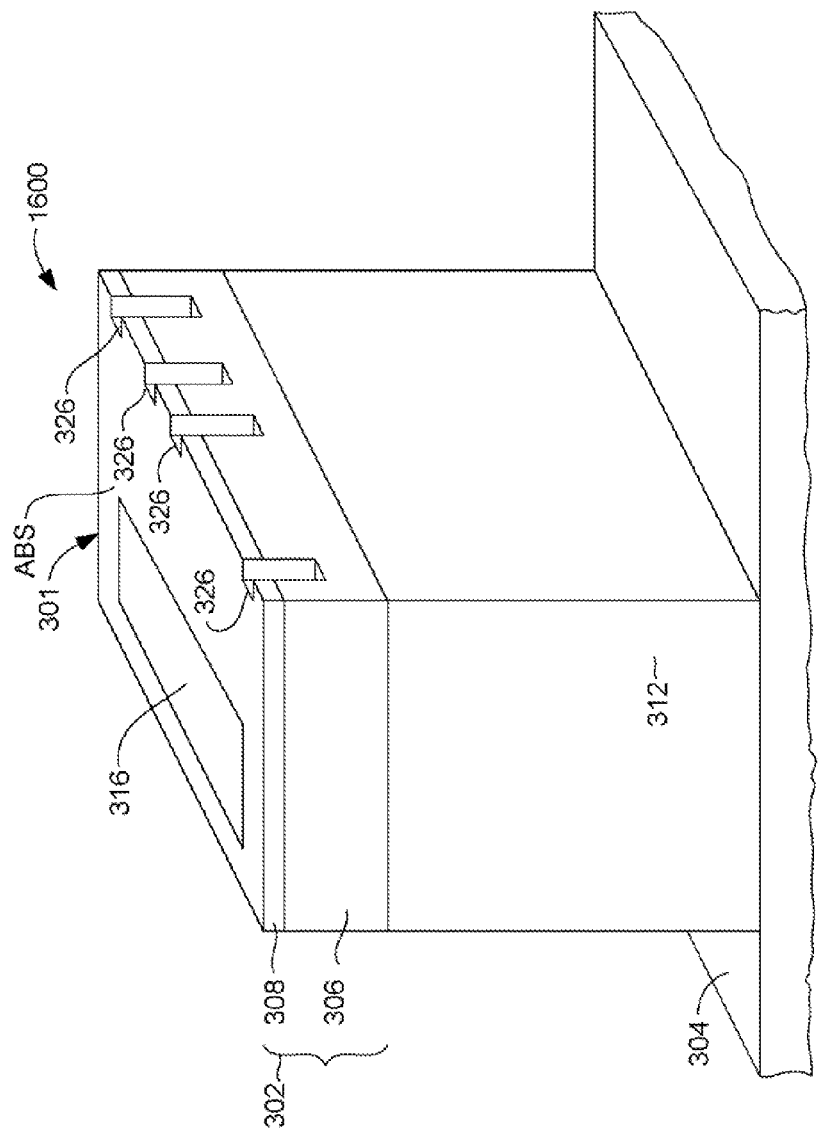
FIG. 16 is a schematic isometric view of an EMR sensor according to yet another embodiment of the invention.

With reference now to FIG. 16, another embodiment of the invention can even further reduce the magnetic spacing in a magnetic data recording device. As shown in FIG. 16, the upper semiconductor layer 310, described above with reference to FIG. 15 has been completely removed. This places the magnetically active layer 308 at the top surface (ABS), minimizing the magnetic spacing in a magnetic data recording device.

The embodiments described with reference to FIGS. 15 and 16 can be used with or without the lead structures described above. Therefore, the notches 326 are optional with regard to the embodiments described with reference to FIGS. 15 and 16. Furthermore, the placement of the magnetically active layer 308 at or near the ABS can also be achieved in a structure such as that described with reference to FIG. 11-13, wherein the layers making up the EMR sensor are not etched or milled to define a mesa structure.

While various embodiments have been described above, it should be understood that they have been presented by way of example only, and not limitation. Other embodiments falling within the scope of the invention may also become apparent to those skilled in the art. For example, although the invention has been described as providing an EMR sensor for use in a magnetic data recording system such as a disk drive, the present invention could also be used in the construction of an EMR sensor to be used in another device such as a scanning magnetometer or in any other application where a magnetic signal can be read. Thus, the breadth and scope of the invention should not be limited by any of the above-described exemplary embodiments, but should be defined only in accordance with the following claims and their equivalents.

What is claimed is:

1. An extraordinary magnetoresistive sensor (EMR sensor), comprising:
   a mesa structure including a semiconductor heterostructure that forms a magnetically active quantum well, the mesa structure having a side;
   a plurality of notches formed in the side of the mesa structure;
   a plurality of electrically conductive leads, each of the electrically conductive leads extending into one of the plurality of notches.

2. An EMR sensor as in claim 1 wherein the heterostructure includes the formation of a 2 dimensional electron gas (2-DEG).

3. An EMR sensor as in claim 1 wherein the heterostructure includes first, second and third semiconductor layers each having a bandgap, the second semiconductor layer being sandwiched between the first and third semiconductor layers and having a bandgap that is smaller than that of the first and third semiconductor layers.

4. An EMR sensor as in claim 1 wherein the notches, leads and electrically conductive shunt structure are defined by a common photolithographic process.

5. An EMR sensor as in claim 1 further comprising an electrically conductive shunt structure electrically connected with the semiconductor heterostructure.

6. An extraordinary magnetoresistive sensor (EMR) sensor structure, comprising:
   a semiconductor heterostructure that forms a magnetically active quantum well;
   a thin electrically insulating layer formed over the semiconductor quantum structure, the thin electrically insulating layer being formed with a plurality of lead openings and a shunt opening; and
   a plurality of electrically conductive leads, each extending into one of the lead openings to contact the semiconductor heterostructure; and
   an electrically conductive shunt structure extending through the shunt opening to contact the semiconductor shunt structure.

7. An EMR sensor structure as in claim 6 wherein the semiconductor heterostructure has not been formed with sides that define a mesa structure, and whereby the active portion of the EMR sensor is defined by the spacial relationship of the leads to one another and between the leads and the shunt structure.

8. An EMR sensor as in claim 6 wherein the semiconductor heterostructure forms a 2 dimensional electron gas (2-DEG).

9. An EMR sensor structure as in claim 6 wherein the semiconductor heterostructure includes first, second and third semiconductor layers each having a bandgap, the second semiconductor layer being sandwiched between the first and third semiconductor layers, the bandgap of the second semiconductor layer being less than that of the first and third semiconductor layers.

10. An EMR sensor structure as in claim 6 wherein the semiconductor shunt structure extends laterally beyond the leads and shunt structure.

11. An extraordinary magnetoresistive sensor (EMR sensor) having an air bearing surface (ABS), the EMR sensor comprising:
   a substrate; and
   a semi-conductor heterostructure formed over the substrate and including a magnetically active layer, wherein the magnetically active layer is disposed within 1-50 nm of the ABS.

12. An EMR sensor as in claim 11 wherein the magnetically active layer is a 2 dimensional electron gas (2-DEG).

13. An EMR sensor as in claim 11 wherein the semiconductor heterostructure comprises first, second and third semiconductor layers each having a bandgap; and wherein
   the second semiconductor layer is sandwiched between the first and second semiconductor layers;
   the bandgap of the second semiconductor layer is smaller than that of the first and third semiconductor layers and the third semiconductor layer is located adjacent to the ABS and has a thickness of 1-10 nm.

14. An EMR sensor as in claim 11, wherein the semiconductor structure consists of first and second semiconductor layers each having a bandgap, the second semiconductor layer being located adjacent to the ABS and having a bandgap that is smaller than that of the first semiconductor layer.

15. An EMR sensor as in claim 11, wherein the magnetically active layer is disposed within 1-10 nm of the ABS.

16. An EMR sensor as in claim 11, wherein the magnetically active layer is disposed within 1-30 nm of the ABS.

17. An extraordinary magnetoresistive sensor (EMR sensor) having an air bearing surface (ABS), the EMR sensor comprising:
   a semi-conductor heterostructure including a magnetically active layer, wherein the magnetically active layer is disposed within 1-10 nm of the ABS, and
   a plurality of electrically conductive leads contacting the magnetically active layer.

18. An EMR sensor as in claim 17 wherein the magnetically active layer is a 2 dimensional electron gas (2-DEG).

19. An extraordinary magnetoresistive sensor (EMR sensor) having a surface, the EMR sensor comprising:
   a substrate; and
   a semi-conductor heterostructure formed over the substrate and including a magnetically active layer, wherein the magnetically active layer is disposed within 1-10 nm of the surface.

20. An EMR sensor as in claim 19 wherein the sensor is incorporated into a scanning magnetometer.

21. A method for manufacturing an extraordinary magnetoresistive sensor (EMR sensor), comprising:
   providing a substrate;
   growing a semiconductor heterostructure on the substrate;
   forming a first mask structure over the heterostructure;
   performing a first material removal process to remove portions of the semiconductor heterostructure that are not protected by the first mask structure to form a mesa structure;
   removing the first mask structure;
   forming a second mask structure, the second mask structure having a plurality of lead defining openings and a shunt defining opening;
   performing a second material removal process to remove portions of the semiconductor heterostructure that are exposed through the lead defining openings and the shunt defining openings; and
   depositing an electrically conductive material.

22. A method as in claim 21, wherein the first and second material removal processes comprise etching.

23. A method as in claim 22, wherein the heterostructure includes first second and third semiconductor layers each having a bandgap, the second semiconductor layer being sandwiched between the first and third semiconductor layer and having a bandgap that is smaller than that of the first and third semiconductor layers.

24. A method as in claim 21 wherein the lead defining openings overlap the mesa structure whereby the second material removal process forms notches in the mesa structure.

25. A method for manufacturing an extraordinary magnetoresistive (EMR) sensor, comprising:
   providing a substrate;
   growing a semiconductor heterostructure over the substrate;
   forming a mask structure over the semiconductor heterostructure, the mask structure having a plurality of lead defining openings, and a shunt defining opening;
   performing a material removal process to remove portions of the semiconductor heterostructure not protected by the mask structure; and
   depositing an electrically conductive material.

26. A method as in claim 25 further comprising, after growing the semiconductor heterostructure and before forming the mask structure, depositing a thin layer of electrically insulating material over the semiconductor heterostructure.

27. A method as in claim 26 further comprising, before forming the semiconductor heterostructure, depositing a selectively etchable buffer layer on the substrate; and
   after depositing the electrically insulating material, performing an etching process to remove at least a portion of the buffer layer to lift off the EMR sensor from the substrate.

* * * * *